United States Patent
Minarcin et al.

(10) Patent No.: US 8,405,355 B2
(45) Date of Patent: Mar. 26, 2013

(54) ENERGY STORAGE SYSTEM ENERGY CAPACITY AND CAPABILITY MONITOR

(75) Inventors: Monika A. Minarcin, River Forest, IL (US); Brian J. Koch, Berkley, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 380 days.

(21) Appl. No.: 12/888,616

(22) Filed: Sep. 23, 2010

(65) Prior Publication Data

US 2012/0074960 A1  Mar. 29, 2012

(51) Int. Cl.
*H02J 7/00* (2006.01)
(52) U.S. Cl. .................................. 320/132; 320/134
(58) Field of Classification Search .................. 320/104, 320/132
See application file for complete search history.

(56) References Cited

U.S. PATENT DOCUMENTS

| | | | |
|---|---|---|---|
| 6,876,098 B1 * | 4/2005 | Gray, Jr. ................. | 290/40 D |
| 2006/0232240 A1 * | 10/2006 | Salasoo et al. ............ | 320/119 |
| 2007/0194756 A1 * | 8/2007 | Cutrona .................... | 320/132 |
| 2007/0279005 A1 * | 12/2007 | Arai ......................... | 320/132 |
| 2008/0197807 A1 * | 8/2008 | Simopoulos et al. ...... | 320/132 |

* cited by examiner

*Primary Examiner* — Samuel Berhanu
(74) *Attorney, Agent, or Firm* — Dinsmore & Shohl LLP (57) ABSTRACT

A method and device for reporting the characteristics of an energy storage system. The method comprises acquiring the open circuit voltage. The method also comprises providing a coulomb capability and a coulomb capacity of the energy storage system based on the open circuit voltage, and determining at least one of an energy capability or an energy capacity of the energy storage system based on at least one of the coulomb capacity, coulomb capability, or combinations thereof.

20 Claims, 4 Drawing Sheets

ENERGY STORAGE SYSTEM ENERGY CAPACITY AND CAPABILITY MONITOR

TECHNICAL FIELD

The present invention relates generally to a method for reporting the characteristics of an energy storage system, and specifically to a method capable of reporting the energy capability and energy capacity of a vehicular energy storage system in such a way that it improves the operation and efficiency of a vehicle.

BACKGROUND

Many devices require an accurate reporting of the characteristics of a battery, capacitor, or related energy storage system (ESS) in order to recognize when additional charging is required. One technique of reporting the characteristics of an ESS involves the State of Charge (SOC), which represents the amount of electrical charge in the system. The problem with reporting the SOC as a characterization of the ESS is that it only gives a percentage of the energy available to the operator of the vehicle. Therefore, the SOC does not accurately represent the true capability or capacity of the ESS, and thus fails to account for the size, age, and recent operational history of the ESS. For example, the SOC may not account for the particular duty loads, driving patterns, and operational cycles undergone. The inaccuracies of a SOC characterization are magnified as it is incorporated into the control systems of hybrid and electric vehicles, which are configured to process only characterizations of the ESS in units of energy.

Accurate reporting of the state of the ESS is important to optimal vehicle operation. Impacted vehicle operations may include charging operation, extended electric range calculations, regenerative energy capture modes, gearing calibrations, and others. Inaccurate reporting of the state may be especially consequential when calculating the range of an electric vehicle, as it could result in a driver prematurely running out of motive power. Unfortunately, accurate reporting of the state of the ESS is hampered by the highly unpredictable duty loads that result from varied driving styles, behaviors, and conditions.

Accordingly, there remains a need for a way to accurately report available energy remaining in energy storage system used in a vehicle.

SUMMARY

In accordance with one embodiment of the present invention, a method for reporting the characteristics of an energy storage system is provided. The method includes acquiring the open circuit voltage of the energy storage system, providing a coulomb capability and a coulomb capacity of the energy storage system based on the open circuit voltage, and determining at least one of an energy capability or an energy capacity of the energy storage system based on at least one of the coulomb capacity, coulomb capability, or combinations thereof.

Optionally, determining the open circuit voltage for the energy storage system includes determining the present state of charge of the energy storage system, calculating the mean state of charge for the energy storage system, and determining the open circuit voltage of the energy storage system based on the mean state of charge and the present state of charge.

Optionally, the method may also include determining a target energy usage window from the energy capability. The target energy usage window includes a maximum and minimum energy usage limit such that the area between the maximum and minimum energy usage limit comprises a sustainable energy usage band.

Optionally, the method may include determining both the energy capability and the energy capacity. Determining the energy capability of the energy storage system may comprise determining the current-resistance compensated voltage for the energy storage system, and calculating the energy capability of the energy storage system based on the open circuit voltage, the coulomb capability, and the current-resistance compensated voltage. Determining the current-resistance compensated voltage may comprise determining a voltage offset of the energy storage system, and calculating a current-resistance compensated voltage based on a sum of the open circuit voltage and voltage offset. Determining the voltage offset of the energy storage system may comprise determining the resistance of the energy storage system, calculating the estimated current of the energy storage system, and determining the voltage offset based on the resistance and current of the energy storage system.

In another embodiment of the present invention, a method for estimating the range of a vehicle that receives at least a portion of its motive power from an energy storage system is provided. The method includes acquiring the open circuit voltage of an energy storage system, providing a coulomb capability and a coulomb capacity of the energy storage system based on the open circuit voltage, determining at least one of an energy capability or an energy capacity of the energy storage system based on at least one of the coulomb capacity, coulomb capability, or combinations thereof, and determining an effective driving range of the vehicle based on the energy capability.

In yet another embodiment of the present invention, a device for controlling the operation of a vehicle that receives at least a portion of its motive power from an energy storage system is provided. The device may include a control system, wherein the control system includes a memory device and a controller. The controller may be programmed to acquire the open circuit voltage of the energy storage system, provide a coulomb capability and a coulomb capacity of the energy storage system based on the open circuit voltage, and determine at least one of an energy capability or an energy capacity of the energy storage system based on at least one of the coulomb capacity, coulomb capability, or combinations thereof.

Optionally, the controller may be programmed to determine a target energy usage window from the energy capacity. Alternatively, the controller may be programmed to determine a target energy usage window from the energy capability. The device may be provided in a vehicle.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1A:
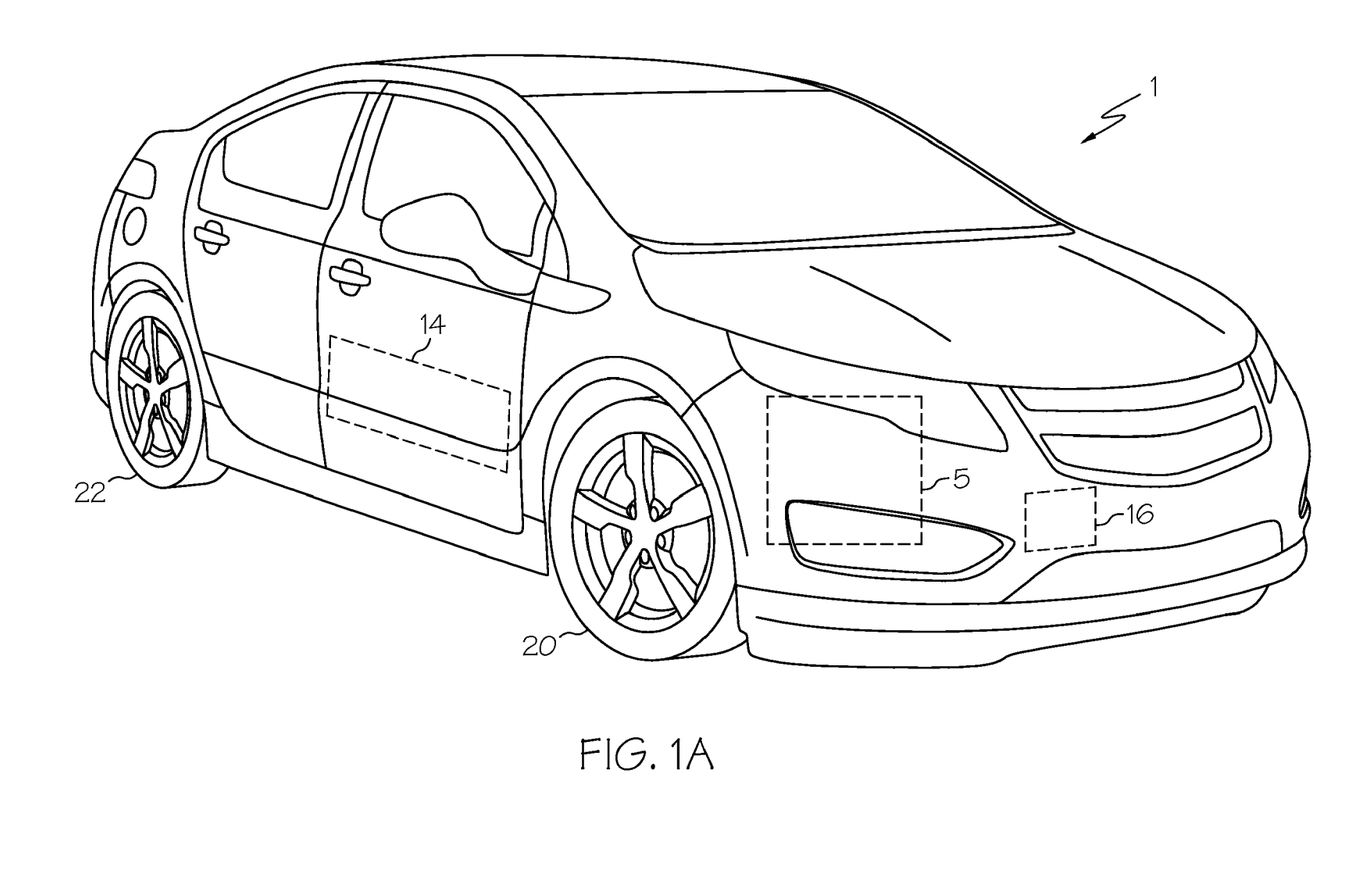
FIG. 1A shows a vehicle employing an energy storage system monitor in accordance with at least one of the embodiments of the present invention.
Figure 1B:
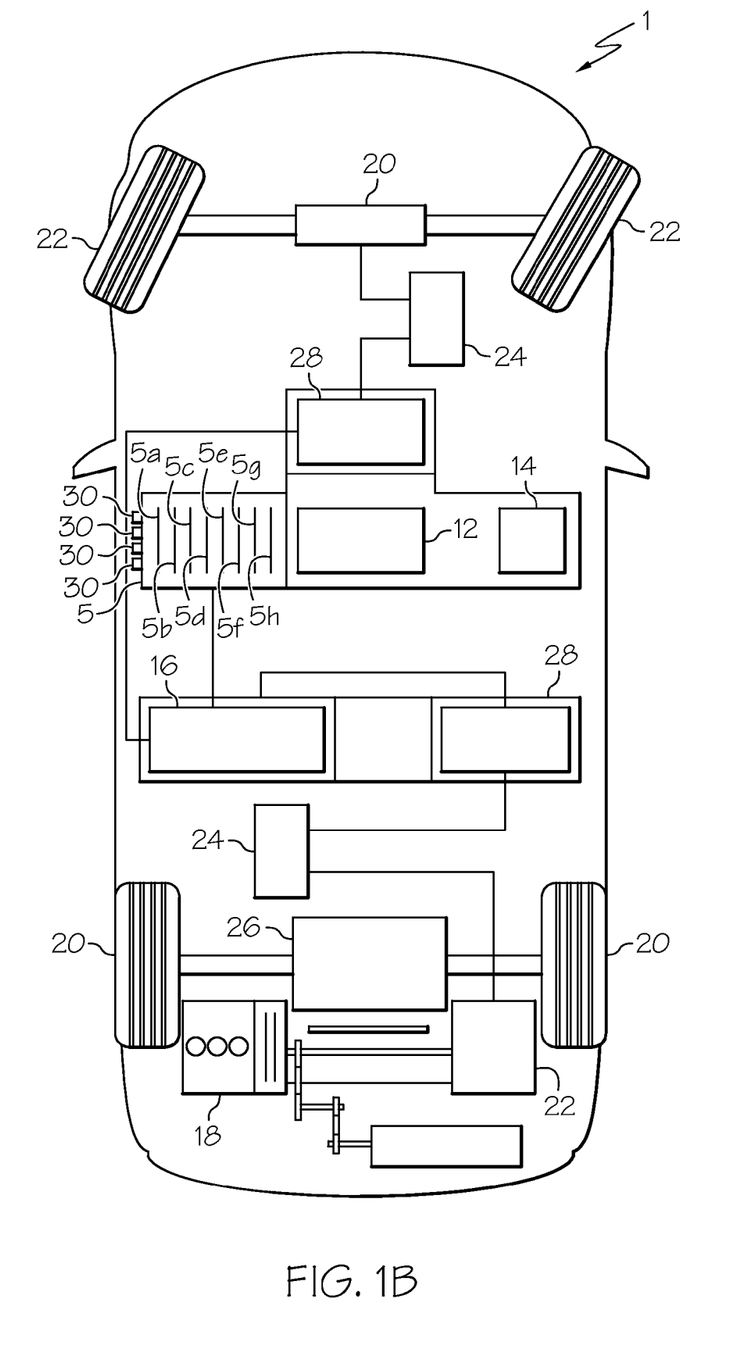
FIG. 1B shows a vehicle platform with a diagrammatic representation of various components that provide motive power thereto.

Referring first to FIGS. 1A and 1B, a vehicle 1, as with the various components configured to provide motive power thereto, is shown. While optionally shown as a car, it will be appreciated by those skilled in the art that the methods disclosed herein may be provided on other platforms, including, but not limited to, trucks, motorcycles, buses, boats, and the like. The vehicle may be front-wheel drive, rear-wheel drive, or combinations thereof. An ESS 5 may comprise a range of energy storage devices, including lithium batteries, alkaline batteries, and other chemical energy storage devices. The ESS may be utilized in a vehicle 1 that derives a portion of its motive power from the ESS 5, or may be applied to other vehicles and devices that will be appreciated by one of ordinary skill.

In addition to the ESS 5, the vehicle 1 may include a memory device 12 and a controller 14. The vehicle 1 may also comprise a hybrid system controller 16, a front and rear wheel set 20, 22, a plurality of DC converters 24, a differential 26, and a power inverter module 28, as will be appreciated by one of ordinary skill. The vehicle may also comprise an internal combustion engine 18, and a plurality of sensors 30 configured to detect the prevailing conditions of the ESS 5. The vehicle 1 may also include other components not described herein that would be useful in combination with a hybrid/electric vehicle.

The ESS 5 may comprise a plurality of modules, wherein each of the plurality of cell modules comprises a plurality of energy storage cells 5a-5h. For example, the ESS 5 may be provided in the form of a bank of lithium-ion batteries. The ESS 5 is configured to supply power to the vehicle 1. It is contemplated that the ESS 5 may supply both motive power and auxiliary power to various systems of a vehicle 1 as will be appreciated by one of ordinary skill in the art. The methods described herein may be applied at the macroscopic level, where the energy capability and capacity of the entire ESS 5 is determined; or at the cell level or the module level, wherein the energy capability and capacity may be determined for each cell and each module 5a-5h that makes up the ESS.

Vehicle 1 may include a hybrid vehicle that derives a portion of its motive power from internal combustion engine 18 and a portion of its motive power from the ESS 5. Alternatively, the ESS 5 may be provided in other vehicles 1 that derive at least a portion of its power from the ESS 5. The ESS 5 may also be used to supply energy to other devices, other than vehicles.

The invention disclosed herein improves ESS 5 efficiency and minimizes the design margin necessary by providing enhanced information about its state. The smaller design margin reduces the cost and improves the performance of the ESS 5. The design margin for the ESS 5 can be expressed in terms of the active material overhead required to meet the energy and power delivery requirements over the life of the system. The active material overhead is the cost of the raw materials necessary to produce the ESS 5. The life of the system is in turn a function of typical utilization, defined as the nominal energy swing and rate of energy usage (power) for a representative duty cycle.

In the case of an ESS 5, the life is inversely proportional to both of these factors. The energy swing is mostly dictated by the needs of application for which the ESS 5 is used, but must also comprehend a tolerance for error in the hybrid control system 16 that governs its operation. For instance, a hypothetical control system 16 comprises sensors, state estimation algorithms, and a means of influencing the flow of energy in to and out of the ESS 5 is capable of knowing the SOC of an ESS 5 with an error of +/−5%. If the ESS 5 can deliver the desired life duration only if the typical energy swing is confined to a window of 20% SOC, then the true window of operation must be reduced to 10% SOC to account for the hybrid control system 16 inaccuracy. Alternatively, the ESS 5 may be over-sized in order to provide an energy buffer for the control system error. In this latter case, this results in an ESS 5 being oversized, which leads to excess weight and size, as well as an additional cost.

The sources of the control error are distributed among the components of the hybrid control system 16, some of it being ascribed to the sensing hardware, and some to the nature of the algorithms that estimate state of charge. This invention is concerned with the latter, specifically with the means of reporting the energy available from the ESS 5 at any given time. As most devices (for example, motors, inverters, or the like) that may be coupled to the ESS 5 are characterized and controlled on the basis of the power they consume or generate, the energy flow through them is best defined by the integral of power with respect to time (energy=power×time). The commonly reported ESS 5 variable, SOC, represents a percentage of the total capacity of the ESS 5, is inconsistent with the reckoning of energy flow through the other devices in the system. Furthermore, the reporting of SOC alone gives an incomplete description of the state of the ESS 5, since the simple percentage says nothing about the relative size of the ESS 5. Accordingly, the methods and systems described herein determine the energy capability and energy capacity in quantities of energy (kWh, kJ, or the like) by accounting for the voltage at which the ESS 5 operates. This energy capability and energy capacity information in units of energy reflects the amount of energy actually available to do meaningful work, and the amount of energy that is lost as heat. The energy capability may also be referred to as the State of Energy.

Energy capacity is understood herein to be the total energy delivery capability of the ESS 5 that has been charged to the utmost of its potential to accept energy under the prevailing conditions of operation. The energy capacity accounts for the voltage at which the transfer of charge takes place. The actual energy capacity of the ESS 5 may vary substantially from the rated capacity determined by the manufacturer, as it may be affected by its particular charging and discharging history, hardware efficiency, as well as by its age.

Energy capability is understood herein to be the present energy content of the ESS 5 that can be removed to perform practical work under prevailing conditions, i.e., where the load and cutoff voltage may be defined as empty. The energy capability is the present energy delivery capability of the ESS 5 at any point during its operation, and as such represents a real-time characteristic.

The coulomb capacity is understood herein as the total charge delivery capability of the ESS 5 which has been charged to the utmost of its potential to accept energy. The coulomb capability is the present charge content of the ESS 5 that can be removed from the ESS 5. The coulomb capacity and coulomb capability, expressed in terms of coulombs (C), ampere-seconds (As), ampere-hours (A-h), etc., pertain only to the number of electrons transferred, whereas the energy capacity and energy capability, expressed in terms of joules (J), watt-seconds (Ws), watt-hours (Wh), etc., account for the voltage at which the transfer occurs. The voltage accounted for includes a thermodynamic (reversible) component, and a loss (irreversible) component. The details of determining the voltage is discussed in detail below.

Figure 2:
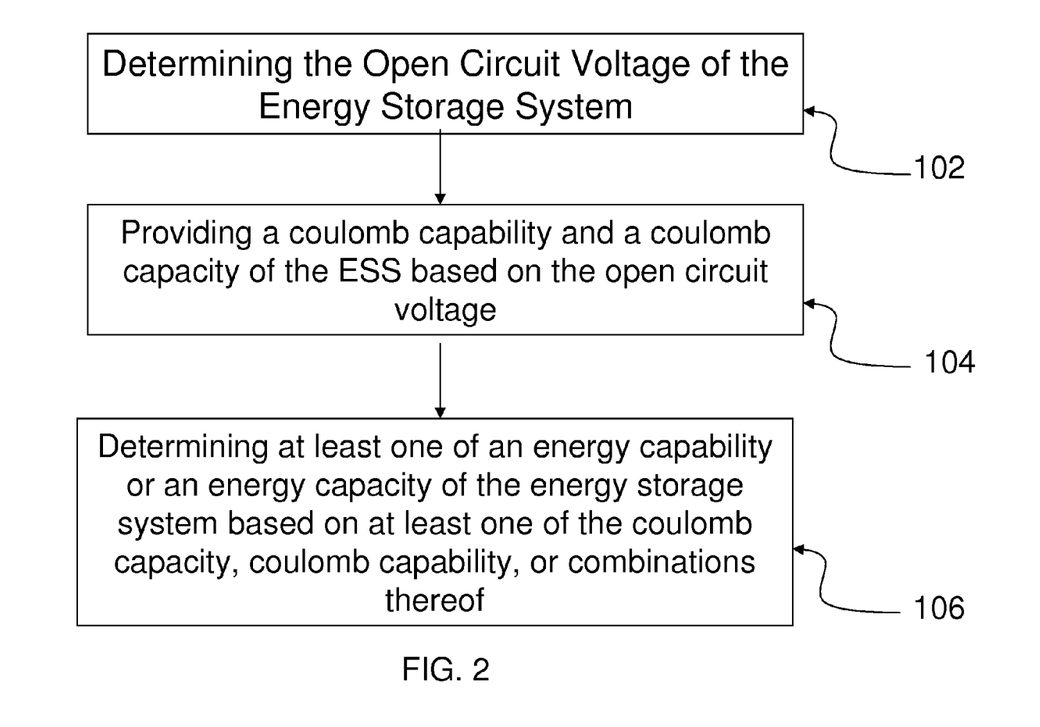
FIG. 2 is a schematic illustration of a method to report the characteristics of an ESS in accordance with one embodiment.

Referring next to FIG. 2, in one embodiment, a schematic of a method for reporting the characteristics of the ESS 5 is provided. The method may comprise acquiring 102 an open circuit voltage of the ESS 5. The method may also comprise providing 104 a coulomb capability and a coulomb capacity of the ESS 5 based on the open circuit voltage, and determining 106 at least one of an energy capability or an energy capacity of the energy storage system based on at least one of the coulomb capacity, coulomb capability, or combinations thereof.

The method may comprise determining both an energy capability and an energy capacity of the ESS 5. The energy capability or energy capacity may be singularly determined, or may both be determined simultaneously depending on the requirements of the vehicle and user. Alternatively, the energy capability may be automatically determined if a coulomb capability is supplied; similarly, an energy capacity may be determined if a coulomb capacity is supplied. Various combinations of the scenarios described above are also contemplated, such that the methods and systems may determine either, or both, of the energy capability and capacity for the ESS 5. The energy capacity may be provided with other systems and algorithms as will be appreciated by one of ordinary skill.

The open circuit voltage mean (OCV_mean) of the ESS 5 may be calculated in a multitude of different ways. In one configuration, the open circuit voltage may be measured directly. In another embodiment, the open circuit voltage may be calculated through a derivative of the SOC calculation. Furthermore, the open circuit voltage may be determined from the battery supplier's data (which may be provided in the form of a lookup table), or from chemical testing. Other ways of calculating the open circuit voltage may also be apparent to one of ordinary skill, and may be used in conjunction with the methods and systems disclosed herein. For example, the OCV_mean may be determined from a combination of chemical parameter mapping data and an equivalent circuit model.

In one embodiment, the OCV_mean may be calculated through an SOC calculation utilizing the present SOC. The present SOC may be defined as the level of charge within the ESS 5 at any given point of time. The SOC is understood to be the present coulomb delivery capability of the ESS 5 expressed as a percentage of total coulomb delivery capability when charged to the utmost of its capacity. As shown in equation (1) below, the SOC is a dimensionless quantity, and a function of the charge capability and charge capacity of the ESS 5:

$$SOC = [capability(A\text{-}h)/capacity(A\text{-}h)] * 100\% \quad (1)$$

The present SOC may be determined in a variety of manners, as will be appreciated by one of ordinary skill. In one configuration, the present SOC may be provided by a battery state estimator algorithm. Alternatively, the present SOC may be determined through A-h integration, or physical testing.

Prevailing conditions are understood to mean the environmental conditions at the time of operation of the ESS 5 that includes temperature, age, and altitude, amongst other factors. The prevailing conditions may be obtained using a plurality of sensors configured to detect voltage, current, and temperature of the ESS 5 at the pack, module, or cell level.

Upon detection, the sensors 30 may communicate the prevailing conditions to a controller 14, for signaling conditioning. The vehicle 1 may comprise a memory device 12 configured to store the detected prevailing conditions data. The controller 14 and memory device 12 may report the prevailing conditions to a hybrid supervisory control system 16 to rely on this information to control vehicle 1 operations.

From the present SOC calculation, a SOC_mean value may be determined. The SOC_mean may comprise the midpoint between the minimum and maximum allowed SOC of the ESS. The minimum (SOC_min) and maximum (SOC_max) SOC may be determined from hardware limitations, manufacturer's recommendations, or experimental data. The following equations demonstrate two potential pathways that may be used to determine the SOC_mean:

$$SOC\_mean = SOC - (SOC - SOC\_min)/2 \text{ for discharge} \quad (2)$$

$$SOC\_mean = (SOC\_max - SOC)/2 + SOC \text{ for charge} \quad (3)$$

In one embodiment, the SOC_mean may be converted into an open circuit voltage (OCV_mean). From the SOC_mean it is assumed that the dependence of the open circuit voltage on the SOC has been established and is known, such that the SOC_mean may be converted into a corresponding OCV_mean value. The conversion may be achieved through the use of calibrated lab tables, algorithms, or chemical mapping data. The OCV_mean may also be measured in another configuration.

The method may also comprise determining the voltage offset of the ESS 5. The voltage offset and OCV_mean may be determined in the same time step. In one configuration, the voltage offset ($V_{offset}$) comprises the product of a current estimate ($I_{Eq}$) and the total resistance ($R_{Total}$) of represents a calibration to account for the effect of the current on the ESS. The $V_{offset}$ the ESS. The $V_{offset}$ of the ESS may be determined from the current estimate and resistance:

$$V_{offset} = I_{Eq} * R_{total} \quad (4)$$

The current estimate ($I_{Eq}$) may be determined according to one of the following methods among others that will be appreciated by one of ordinary skill. The current estimate may be estimated based on the measured current flowing into and out of the ESS 5, which may vary a great deal from one instant to the next. The current estimate may represent a quantity of current, such that if the current were fixed and applied to the ESS 5 continuously, the nominal voltage under the current estimate would be the same as it had been under the actual conditions of varying current. In one configuration, a current estimate may be provided under the prevailing conditions of the ESS 5.

In one embodiment, the current estimate may comprise the root mean squared (RMS) current of the ESS 5. Alternatively, the current estimate may comprise the average of the current for the ESS 5 across a calibrated time period. The time period may be adjusted to represent a typical range of ESS 5 operation. The current estimate may be calculated over a range of time periods. The length of time for the current estimate may be selected based on the particular chemistry of the ESS 5 utilized, the operating region, the desired performance characteristics, or combinations thereof. It is also contemplated that the current estimate may be determined with other methods as will be appreciated by one of ordinary skill.

The total resistance ($R_{Total}$) of the ESS 5 may be calculated in a variety of ways. The total resistance ($R_{Total}$) may comprise the charge transfer resistance ($R_{ct}$), the ohmic resistance ($R_{ohm}$), the diffusion resistance ($R_{diff}$), and combinations thereof. Therefore, in one configuration, the total resistance ($R_{Total}$) comprises a combination of $R_{ct}$, $R_{ohm}$, and $R_{diff}$. It is also contemplated that only certain resistance components of the total resistance may be used for certain embodiments.

Each of the above mentioned resistance components may be calculated from equivalent circuit models, chemical mapping data, or algorithms as will be appreciated by one of ordinary skill. In one configuration, the resistance components may be calculated using a predictive circuit model that accounts for the prevailing conditions. The algorithm may blend chemical parameter mapping data and the results of at least one predictive circuit model. Other forms of determining the resistance components are also contemplated. The circuit model algorithm may account for the voltage, current, and resistance elements provided in an ESS 5, and an output a plurality of resistance values as will be appreciated by one of ordinary skill.

The resistance of the ESS 5 is dynamic, and may change over time. For example, the resistance may be affected by the changing chemical composition, age, and the throughput of the ESS 5. Accordingly, determining the resistance of the ESS 5 in an accurate manner to include these factors is important in determining a meaningful characterization of the energy capability and energy capacity of the ESS 5.

The current-resistance compensated voltage ($V_{mean}$) accounts for the $V_{offset}$ and the OCV_mean of the ESS 5. The current-resistance compensated voltage may comprise the sum of the $V_{offset}$ and the open circuit voltage. In one embodiment, determining the current-resistance compensated voltage may comprise determining the mean open circuit voltage for the ESS and determining the $V_{offset}$ of the ESS 5. From the mean open circuit voltage and the $V_{offset}$, the $V_{mean}$ may be determined. In one possible configuration, the following equation may be used to determine the $V_{mean}$:

$$V_{mean} = OCV\_mean + V_{offset} \quad (5)$$

Once the $V_{mean}$ is determined, the energy capability and energy capacity may be determined. In order to determine the energy capability and energy capacity, the coulomb capability and coulomb capacity, respectively, of the ESS 5 must be supplied or determined. If only the energy capacity of the ESS 5 is to be determined, only the coulomb capacity may be required. Similarly, if only the energy capability of the ESS 5 is to be determined, only the coulomb capability may be required. It is also contemplated that both the energy capability and energy capacity may be determined, and therefore, both the coulomb capability and coulomb capacity of the ESS 5 may be determined and utilized by the methods and systems disclosed herein. Both the coulomb capability and coulomb capacity are provided in units of electrical charge, and represent only the number of electrons transferred. Therefore, they fail to account for the voltage at which the transfer of electrons occurs within the ESS 5, and $V_{mean}$ must be comprehended to accurately characterize the ESS 5.

In one configuration, the energy capability may be calculated accordingly to the following equation:

$$Capability\_energy = Capacity\_coulomb * V\_mean * present\ SOC/100 \quad (6)$$

Similarly, the energy capacity may be determined by utilizing the following equation:

$$Capacity\_energy = Capacity\_coulomb * V\_mean \quad (7)$$

Figure 3:
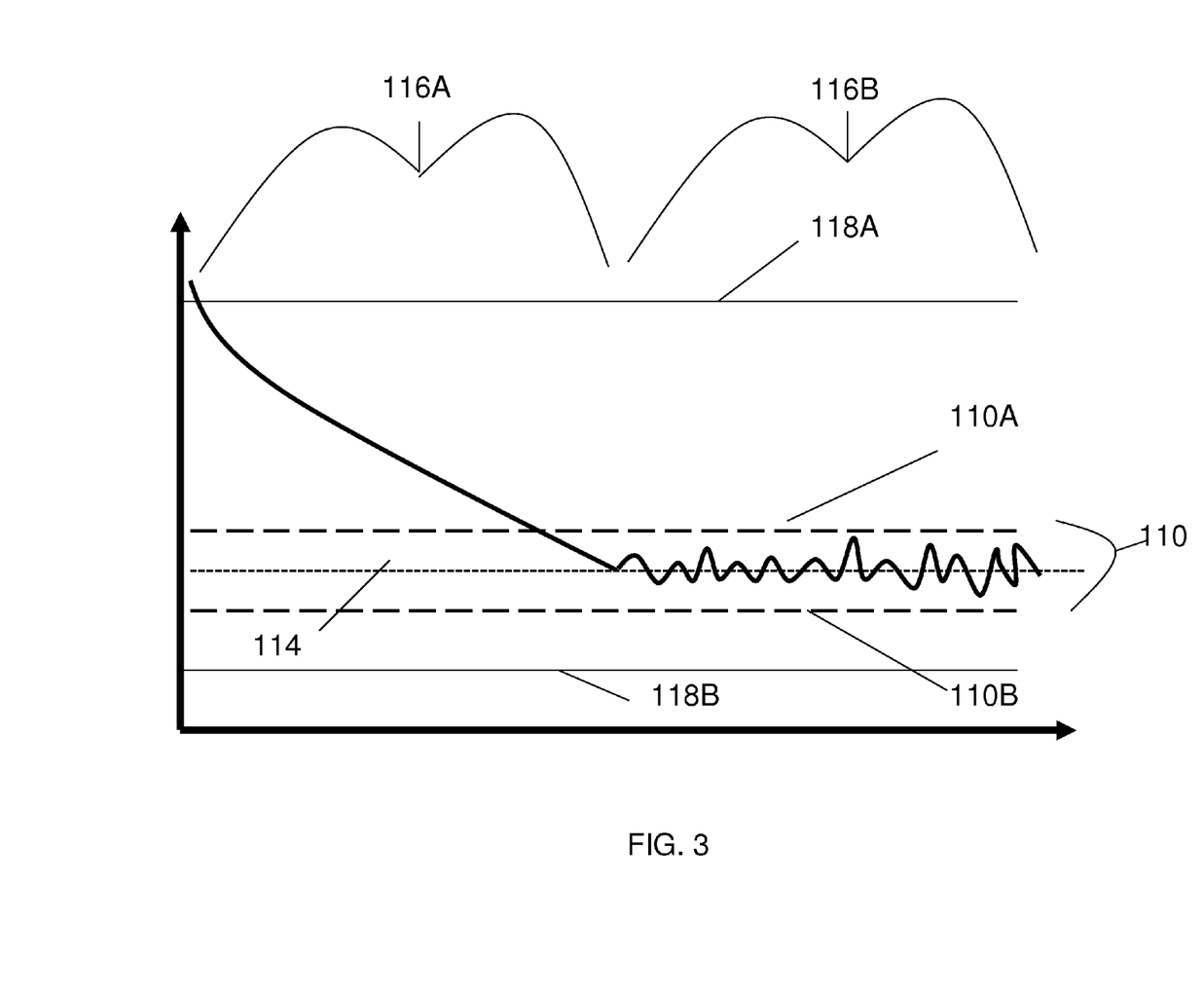
FIG. 3 is an illustration of target energy usage window in accordance with another embodiment.

Referring to FIG. 3, in one embodiment, the method comprises determining a capability target energy usage window 110 from the energy capability of the ESS 5. The capability target energy usage window comprises a maximum 110A and minimum 110B energy usage limit. The method may comprise controlling the energy charge and discharge rates of the ESS in the vehicle to stay within the target energy usage window 110. The controller 14 from FIG. 1B may be programmed to keep the energy charge and discharge rate within the maximum 110A and minimum 110B energy usage limits. The method also may comprise controlling the vehicle 1 to operate at, or near, a charge sustaining energy consumption rate 114 within the target energy usage window. The rate of energy charge and discharge may be represented as energy over time, as indicated by the curve 116, where an initial period 116A corresponds to a charge-depleting mode of operation, and a later period 116B corresponds to a charge-sustaining period of operation.

In one embodiment, the initial period 116A refers to a charge depleting operation. The charge depleting mode refers to a mode in which the SOC or energy capability may fluctuate but, on average, decreases while the vehicle is driven. The later period 116B refers to a charge sustaining mode. Charge sustaining mode is an operating mode in which the SOC or energy capability of the ESS may fluctuate, but on average, is maintained at a certain level while the vehicle is driven. For both the charge sustaining mode and the charge depleting mode, one may want to restrict the fluctuation in the energy capability. For example, one may allow unlimited charging in the charge depleting mode, but limited charging in charge sustaining mode. The charging may be completed through some sort of regenerative mechanism, i.e., regenerative braking or coast down energy capture as will be appreciated by one of ordinary skill. In one configuration, the method may be configured to prevent large subsequent charging and then discharging as one might encounter by driving an EV/HEV with regenerative capability in heavy traffic or through a series of rolling hills where the ESS tends to cycle relatively deeply. Such operation may cause the ESS to age rapidly in some chemistries. Accordingly, the method may comprise controlling the charge depleting mode and charge sustaining mode to restrict the charging rates.

The maximum 110A and minimum 110B capability energy usage limits may be determined from chemical mapping data, hardware restrictions, and limitations determined necessary for improved ESS 5 life and system performance. In one configuration, the maximum and minimum energy usage limits may correlated to the end of life (EOL) and beginning of life (BOL) expected energy capacity limits for the ESS 5. The EOL and BOL limits are typically determined by the duty cycle, environment, regulation, and cell/battery chemical composition and ESS hardware limitations. The BOL limits may be more or less restrictive than the EOL limits depending on the energy usage strategy of the vehicle. For example, the limits may be opened up as the ESS degrades in order to allow for the same amount of consumable energy to be available to the hybrid operating system at EOL as was available at BOL. These limits may then be constrained sharply once the EOL of the ESS is near in order to allow for the maximal use of the ESS until it can be replaced or repaired. The method may also comprise providing protective maximum 118A and minimum 118B energy usage limits which represent a buffer to prevent damage to the ESS 5. The protective maximum and minimum energy usage limits may be placed at appropriate energy levels depending on the cell chemistry and the conditions of cell operation. In one possible configuration, the maximum 118A may be around 95% capacity, while the minimum 118B may be around 10% capacity for a charge depleting hybrid. The minimum and maximum may vary depending on the status of the ESS, and whether it is charging or discharging. It is contemplated that the maximum 118A may range from about 20% to about 100% capacity. Similarly, the minimum 118B may range from about 10% to about 80% capacity. However, the protective maximum and minimum limits may be calibrated to suit the type of energy storage system utilized, or to achieve a particular objective, such as maximum fuel economy, cell longevity, or the like.

The method may further comprise determining a range of a vehicle 1 based on the energy capability of the ESS. The range may be calculated based on the energy capability, and may be converted to units of distance, based on the energy used to propel the vehicle under the current conditions. The controller 14 of a vehicle 1 may be configured to display its range in units of distance to a driver. The controller 14 of a vehicle may also be configured to warn a driver when the range of the vehicle dips below a predetermined threshold.

In one configuration, the method further comprises determining a capacity target energy usage window from the capacity of the ESS 5 in units of energy. The method may also comprise determining an age parameter of the ESS 5 based on the capacity target energy usage window. The age parameter may adjust pertaining to the age of the energy storage system, to compensate for the limitations of an older or remanufactured ESS. For example, the modules within the ESS 5 may indicate varying reduced capacity and capability due to replacement or other factors, and the age parameter may comprise an adjustment of the maximum and minimum limits, as well as an adjustment of the target energy usage window allowing for the ESS 5 as a whole to be used optimally to extend life.

The capacity target energy usage window may comprise a maximum and minimum capacity limit. The maximum and minimum capacity energy usage limits may be determined from chemical parameter mapping data and other limitations determined necessary for improved ESS 5 life, or improved system performance. In one configuration, the maximum and minimum energy usage limits may be correlated to the end of life (EOL) and beginning of life (BOL) values.

The method may also comprise allocating a total amount of commanded charging and discharging power among the plurality of cells/modules 5a-5h based on the energy capability or capacity of each of the plurality of cells/modules 5a-5h. In one potential configuration, the module having the highest energy capability is allocated to discharge first, and the module having the lowest level of energy capability is allocated to recharge first. Alternatively, the method may comprise discharging at least two modules having the highest level of charge, and recharging the at least two modules having the lowest level of charge. In addition, the method may comprise alternative preferences on the order of discharge and recharge depending on the energy capability and energy capacity of the ESS.

The vehicle 1 may comprise a controller 14. The energy capability and energy capacity of the ESS 5 in units of energy may be reported in real-time to the controller 14 as calculated herein. The real-time reporting allows a user to have an accurate portrayal of how much energy remains in the ESS 5 at any instant of time during the operation of the vehicle. The controller 14 may be integrated within the hybrid system controller 16 and other systems of the vehicle 1, and communicate the energy capability, energy capacity, and target energy usage window to other systems of the vehicle, which allows such systems to operate the vehicle to maximize performance, efficiency, longevity, and other optimizable parameters.

In another aspect, an article of manufacture to report the characteristics of an ESS 5 are discussed. The article of manufacture comprises a plurality of intercommunicative computer usable mediums. In at least one of the computer useable mediums include computer-readable program code are embodied therein for acquiring the open circuit voltage of the ESS 5. At least one of the computer useable mediums comprises computer-readable program code means embodied therein for providing a coulomb capability and a coulomb capacity of the ESS 5 on the open circuit voltage. At least one of the computer useable mediums comprises computer-readable program code means embodied therein for determining at least one of an energy capability or an energy capacity of the ESS 5 based on at least one of the coulomb capacity, coulomb capability, or combinations thereof. The article of manufacture may also include other computer useable mediums comprising computer-readable program code configured to perform other steps of the methods disclosed herein.

For the purposes of describing and defining the present invention, it is noted that reference herein to a variable being a function of a parameter or another variable is not intended to denote that the variable is exclusively a function of the listed parameter or variable. Rather, reference herein to a variable that is a function of a listed parameter is intended to be open ended such that the variable may be a function of a single parameter or a plurality of parameters.

It is also noted that recitations herein of "at least one" component, element, etc., should not be used to create an inference that the alternative use of the articles "a" or "an" should be limited to a single component, element, etc.

It is noted that recitations herein of a component of the present disclosure being "programmed" in a particular way, "configured" or "programmed" to embody a particular property, or function in a particular manner, are structural recitations, as opposed to recitations of intended use. More specifically, the references herein to the manner in which a component is "programmed" or "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method for reporting the characteristics of an energy storage system, the method comprising:
   acquiring the open circuit voltage of the energy storage system;
   providing a coulomb capability and a coulomb capacity of the energy storage system based on the open circuit voltage; and
   determining at least one of an energy capability or an energy capacity of the energy storage system based on at least one of the coulomb capacity, coulomb capability, or combinations thereof such that the determining comprises:
      determining the present state of charge of the energy storage system;
      calculating the mean state of charge for the energy storage system; and
      determining the open circuit voltage of the energy storage system based on the mean state of charge and the present state of charge.

2. The method of claim 1, further comprising determining a target energy usage window from the energy capability.

3. The method of claim 2, wherein the target energy usage window comprises a maximum and minimum energy usage limit such that the area between the maximum and minimum energy usage limit comprises a sustainable energy usage band.

4. The method of claim 1, further comprising determining both the energy capability and the energy capacity.

5. The method of claim 1, wherein determining the energy capability of the energy storage system further comprises:
   determining the current-resistance compensated voltage for the energy storage system;
   calculating the energy capability of the energy storage system based on the open circuit voltage, the coulomb capability, and the current-resistance compensated voltage.

6. The method of claim 5, wherein determining the current-resistance compensated voltage comprises:
   determining a voltage offset of the energy storage system; and
   calculating a current-resistance compensated voltage based on a sum of the open circuit voltage and voltage offset.

7. The method of claim 6, wherein determining the voltage offset of the energy storage system comprises:
   determining the resistance of the energy storage system;
   calculating the estimated current of the energy storage system;
   determining the voltage offset based on the resistance and current of the energy storage system.

8. The method of claim 7, wherein the resistance comprises an estimate from circuit model algorithm.

9. The method of claim 1, wherein the energy storage system is provided as part of a vehicle that derives at least a portion of its motive power from the energy storage system.

10. The method of claim 9, further comprising:
    determining an effective driving range of the vehicle based on the energy capability; and
    conveying the effective range to a user-readable display.

11. The method of claim 1, wherein determining the energy capacity of the energy storage system comprises:
    determining the current-resistance compensated voltage for the energy storage system; and
    calculating the energy capacity based on the current-resistance compensated voltage and the charge capacity of the energy storage system.

12. The method of claim 1, further comprising determining a target energy usage window from the energy capacity.

13. The method of claim 1, wherein the energy storage system comprises a plurality of energy storage modules, and the method further comprises allocating a total of amount of commanded charging and discharging power among the plurality of energy storage modules based on the energy capability of each of the plurality of energy storage modules.

14. The method of claim 1, wherein acquiring the open circuit voltage is selected from the group consisting of direct measurement, calculating from a state of charge, receiving from manufacturer's data, and determining from chemical testing.

15. A method for estimating the range of a vehicle that receives at least a portion of its motive power from an energy storage system, the method comprising:
    acquiring the open circuit voltage of an energy storage system;
    providing a coulomb capability and a coulomb capacity of the energy storage system based on the open circuit voltage;
    determining at least one of an energy capability or an energy capacity of the energy storage system based on at least one of the coulomb capacity, coulomb capability, or combinations thereof such that the determining comprises:
       determining the present state of charge of the energy storage system;
       calculating the mean state of charge for the energy storage system; and
       determining the open circuit voltage of the energy storage system based on the mean state of charge and the present state of charge; and
    determining an effective driving range of the vehicle based on at least one of the energy capacity and the energy capability.

16. The method of claim 15, further comprising displaying the effective driving range of the vehicle to a user.

17. A device for controlling the operation of a vehicle that receives at least a portion of its motive power from an energy storage system, the device comprising a control system comprising a memory device and a controller, wherein the controller is programmed to:
    acquire the open circuit voltage of the energy storage system;
    provide a coulomb capability and a coulomb capacity of the energy storage system based on the open circuit voltage; and
    determine at least one of an energy capability or an energy capacity of the energy storage system based on at least one of the coulomb capacity, coulomb capability, or combinations thereof such that the determined energy capability or energy capacity comprises:
       a determined present state of charge of the energy storage system;
       a calculated mean state of charge for the energy storage system; and
       a determined open circuit voltage of the energy storage system that is based on the mean state of charge and the present state of charge.

18. The device of claim 17, wherein the controller is programmed to determine a target energy usage window from the energy capacity.

19. The device of claim 17, wherein the controller is programmed to determine a target energy usage window from the energy capability.

20. A vehicle incorporating the device of claim 17.

* * * * *